United States Patent [19]

Kanow

[11] 3,864,637

[45] Feb. 4, 1975

[54] FREQUENCY REGULATION OF VOLTAGE CONTROLLED OSCILLATORS USING CLOCK-DRIVEN DIGITAL COUNTERS

[75] Inventor: Willy Kanow, Berlin, Germany

[73] Assignee: Loew Opta GmbH, Berlin, Germany

[22] Filed: Mar. 7, 1973

[21] Appl. No.: 338,986

[30] Foreign Application Priority Data

Mar. 10, 1972 Germany............................ 2211664

[52] U.S. Cl................... 325/470, 331/1 A, 331/16, 331/18

[51] Int. Cl............................................. H04b 1/32

[58] Field of Search...... 325/468, 469, 470; 334/16; 331/1 A, 18, 16, 111, 113 R

[56] References Cited

UNITED STATES PATENTS

| | | | |
|---|---|---|---|
| 3,364,437 | 1/1968 | Loposer et al. | 331/1 A |
| 3,516,007 | 6/1970 | Bos et al. | 331/18 |
| 3,573,734 | 4/1971 | Williams et al. | 325/455 |
| 3,651,469 | 3/1972 | Keese | 325/470 |
| 3,689,849 | 9/1972 | Swanson et al. | 331/1 A |
| 3,753,142 | 8/1973 | Nardin et al. | 331/1 A |
| 3,757,224 | 9/1973 | Klank | 325/470 |

*Primary Examiner*—Benedict V. Safourek
*Assistant Examiner*—Aristotelis M. Psitos

[57] ABSTRACT

An arrangement is disclosed for programming a desired count in a first N-stage digital counter employed in a frequency control circuit for a variable voltage oscillator in a radio receiver. A second N-stage digital counter stepped by a clock pulse generator is provided with auxiliary outputs representing the count in each stage thereof in a format compatible with the programming input of the first counter. The count of each stage of the first counter may be set selectively either from a memory bank associated with the corresponding stage of the second counter, or directly from the auxiliary output of such corresponding stage. Means are described for disabling the clock pulse generators whenever the receiver detects a transmitted signal whose amplitude exceeds a predetermined threshold.

7 Claims, 5 Drawing Figures

PATENTED FEB 4 1975

3,864,637

SHEET 3 OF 4

FREQUENCY REGULATION OF VOLTAGE CONTROLLED OSCILLATORS USING CLOCK-DRIVEN DIGITAL COUNTERS

BACKGROUND OF THE INVENTION

It has been common to employ variable frequency dividers in closed-loop frequency control circuitry for voltage controlled oscillators. In recent times, communications receivers having such VCO's have employed, for frequency division purposes, digital counters having a plurality of stages in cascade.

In general, such counters are externally programmable as to count and serve to divide the output frequency of the VCO (or a submultiple thereof) by a factor determined by the programmed count of the counter.

The desired count is generally entered in the counter by separate manual selector switches individually associated with the counter stages, wherein each switch outpulses the required command pulses in binary coded decimal form to an auxiliary input of the associated counting stage.

The necessity of manually operating such separate switches each time a change is desired in the count of the counter has made the adjustment of such counters a relatively time-consuming affair. Such tediousness is even worse when employing such manual switches to adjust the VCO frequency during a signal-seeking operation of the receiver, i.e., where the count must be continuously incremented to sweep the frequency band of the receiver in search of a strong transmitted frequency picked up by the receiver. It will be recognized that for this latter situation the selector switch for the lowest order stage of the counter would have to be repetitively operated to step the counter stages through the successive counts necessary to instrument the sweep function.

SUMMARY OF THE INVENTION

The disadvantages of such manual programming schemes for N-stage frequency-division digital counters (N being an integer) may be alleviated by the programming arrangements of the present invention.

These arrangements contemplate a second N-stage digital counter whose lowest order stage has its counting input coupled to the output of a clock pulse generator. Each stage of the second counter is provided with an auxiliary S-bit parallel output which exhibits the count of such stage, and such parallel output serves as the source of command signals for programming an identical count in the corresponding stage of the first counter, i.e., the frequency divider counter.

The arrangements of the invention may selectively be operated automatically in (1) a preselect mode in which case the command signals from the second counter are arranged to program the first counter in one of a plurality of fixed counts representative of fixed transmitted signals incident on the receiver, or (2) a sweep frequency mode, in which case the command signals from the second counter successively increment the count in the first counter to correspondingly vary the frequency of the VCO. In partcular, when the preselect mode is used, a desired count, once set in one of the stages of the second counter by the clock pulse generator, is written into a then-addressed S-bit storage location of a memory bank associated with such stage, and the contents of such storage location are thereafter read out when desired to the auxiliary (programming) input of the corresponding stage of the first counter through a first position of a suitable two-position electronic gate.

When the frequency sweep mode is used, e.g., for signal seeking purposes, the count in the second counter is successively incremented by the clock pulse generator. The binary coded S-bit representation of the continuously varying count in each stage of the second counter is directly coupled via a second position of the electronic gate to the programming input of the first counter. When a strong transmitted signal is detected at the receiver during the resulting frequency sweep of the VCO, the clock pulse generator is disabled to stop the sweep and thereby permit the receiver to lock on the strong station detected.

BRIEF DESCRIPTION OF THE DRAWING

The invention will be further set forth in the following detailed description taken in conjunction with the appended drawing, in which.

DETAILED DESCRIPTION

Figure 1:
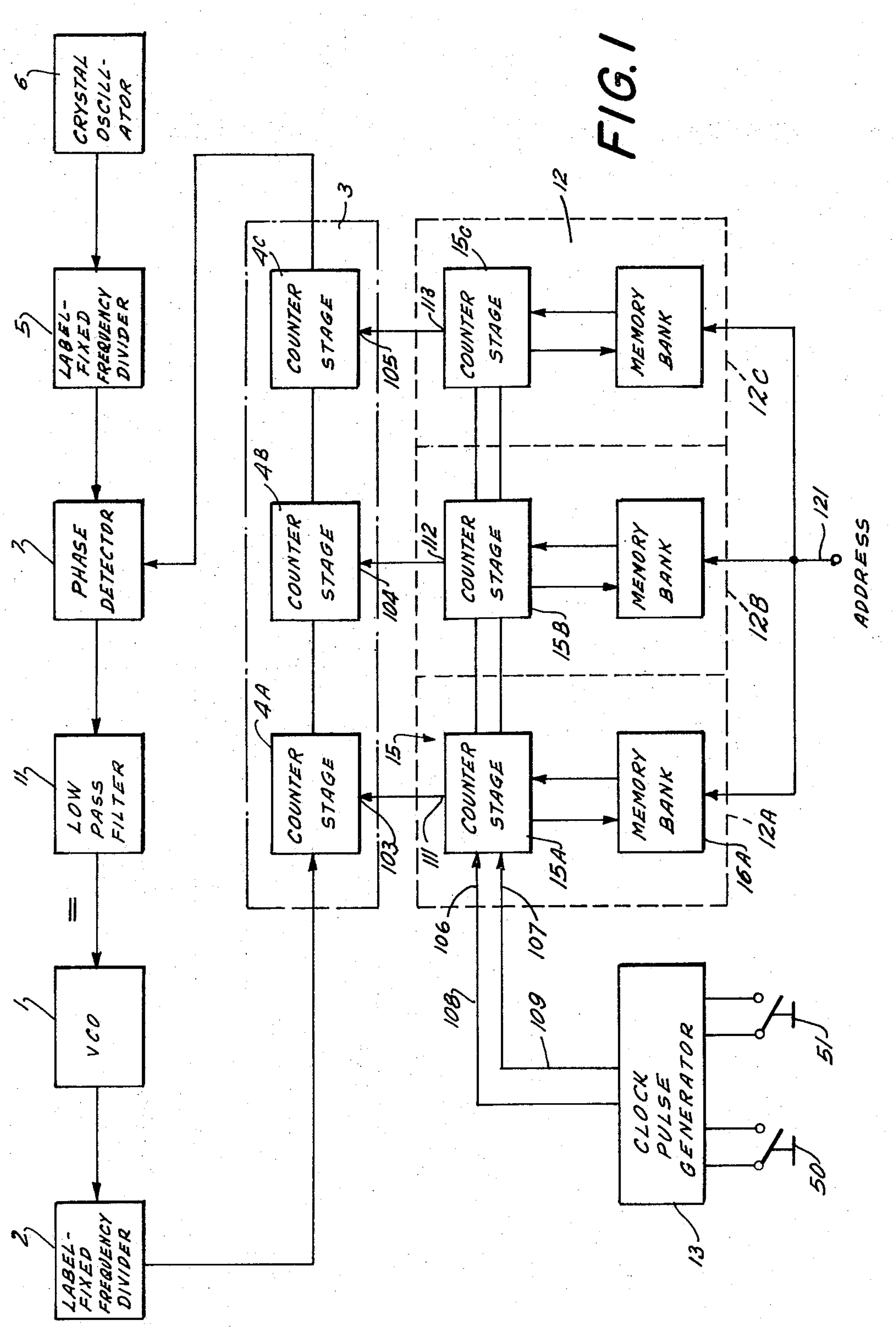
FIG. 1 is a block diagram of an arrangement in accordance with the invention for automatically programming the count of a digital counter frequency divider for controlling a VCO in a communications receiver.

Referring now to the drawing, FIG. 1 depicts a conventional control loop for adjusting the output frequency of a voltage controlled oscillator (VCO) 1, which may be illustratively employed as the local oscillator in the tuning stage of a communications receiver (not shown). The RF output of the illustrated VCO is applied through a fixed frequency divider 2 to the counting input of the lowest order one of N of identical stages 4A, 4B and 4C of an N-stage programmable digital counter 3, where N is an integer equal to three in the instant description.

The counter 3 is employed as a variable frequency divider in the control loop and conventionally exhibits, at its output, one pulse for each plurality of pulses applied to its input equal to the programmed count of the counter.

The divided frequency at the output of the counter 3 is applied to one input of a phase detector 7. A reference frequency generated by a crystal oscillator 6 is divided by a fixed frequency divider 5 having the same division ratio as the fixed divider 2, and is applied to a second input of the phase detector 7.

The output of the phase detector is applied to a low pass filter 11 to derive a DC output voltage. Such voltage adjusts the variable capacitance diodes (not shown) of the VCO 1 in such a direction as to drive the output frequency of the VCO toward a value proportional to the frequency of the crystal oscillator 6 divided by the count programmed in the counter 3.

The desired count in the several stages 4A, 4B and 4C of the counter 3 is illustratively established by the S-bit digital command signals individually applied to auxiliary inputs 103, 104, and 105, respectively. (For purposes of the following description, S is an integer equal to 4). In accordance with the invention, such digital command signals (which may be conveniently arranged in binary coded decimal form) are provided automatically for the individual stages 4A, 4B and 4C of the counter 3 by control units 12A, 12B and 12C, respectively. Such control units include successive identical stages 15A, 15B and 15C of a second N-stage digital counter 15 which may be conventionally adapted for bidirectional count operation, as shown.

The lowest order stage 15A of the second counter has forward and reverse counting inputs 106 and 107 which are respectively coupled to separately excitable outputs 108, 109 of a push-button operated clock pulse generator 13. The generator 13 is so arranged that a depression of push button 50 causes a succession of clock pulses to appear at output 108, thereby stepping the counter 15 in a forward direction while the push button 50 remains depressed. Similarly, the depression of push button 51 causes such succession of clock pulses to appear at output 109, thereby stepping the counter 15 in the reverse direction while the push button 51 remains depressed.

The stages 15A, 15B and 15C of the second counter 15 are individually provided with auxiliary S-bit parallel outputs 111, 112 and 113. The outputs 111, 112 and 113 exhibit (in a binary coded decimal form compatible with that used to set the corresponding auxiliary inputs 103, 104 and 105 of the counter 3) the instantaneous count to which the stages 15A, 15B and 15C have been stepped by the clock pulse generator 13. As indicated below, the information at the outputs 111, 112 and 113 serve as the programming commands for the stages 4A, 4B and 4C of the counter 3.

In further accordance with the invention, such programming commands from the stages 15A, 15B and 15C are made available for use in either an automatic preselection mode of the receiver (whereupon a predetermined transmitter station represented by a prescribed count in the counter 3 can be programmed therein) or in a frequency sweep mode adapted for signal-seeking and lock-on purposes, as described below.

Figure 2:
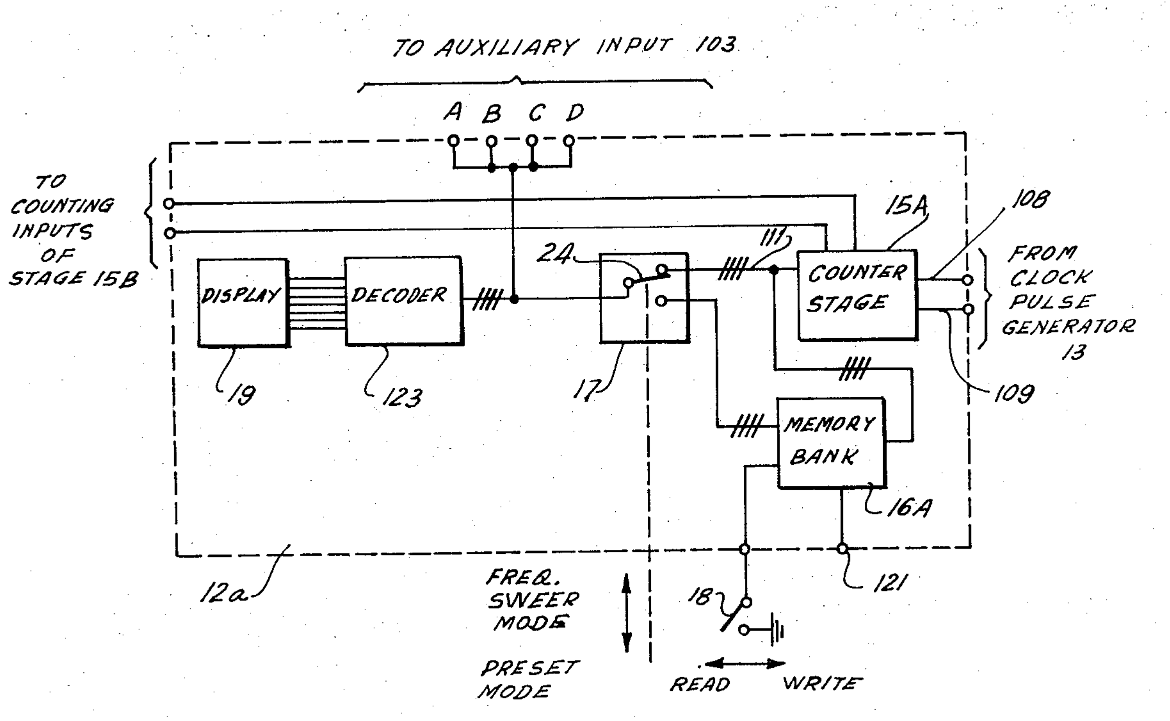
FIGS. 2 and 3 are combined block and schematic diagrams showing one stage of the automatic programming arrangement of FIG. 1 in successively more detail.

Such modes of operation are depicted more clearly in connection with FIG. 2, which for convenience of illustration shows the arrangement only in connection with the lowest order stage 15A of the counter 15. The auxiliary 4-bit output 111 of the stage 15A is applied directly to a first input of a two-position gating circuit 17, whose output is coupled to the auxiliary 4-bit input 103 of the associated stage 4A of the counter 3 (FIG. 1). The output 111 is also applied to an associated memory bank 16A, which in response to a "write" command initiated by a read-write switch 18 transfers the count then appearing at output 111 to an addressed one of a plurality of S-bit storage locations in the memory bank 16A. Such address, in turn, is controlled by an appropriate command applied to the bank 16A through an input 121 thereof.

The storage of the count of the stage 15A, in association with a similar storage of the simultaneous count of the other stages 15B and 15C of the counter 15 in corresponding storage locations of associated memory banks 16B and 16C (FIG. 1) identical to bank 16A, permits an arbitrary member of transmitted station frequencies handled by the receiver (up to the maximum storage capacity of the memory banks 16A, 16B, 16C) to be presetin the control unit 12 by operating the clock pulse generator 13 until the desired count is obtained in each stage 15A, 15B and 15C (as visually indicated, e.g., in a count display 19 associated with the counter stage 15A through the gating circuit 17 and decoder 123), and then writing such count into a unique storage location in the associated memory banks.

In order to operate the illustrated stage 15A (FIG. 2) in the preselect mode, the 4-bit output of the memory bank 16A is applied to a second input of the gating circuit 17. A selection switch 24 is arranged to connect the first input of the gating circuit 17 to its output when in the illustrated upper position and to connect the second input of the circuit 17 to such output when in the illustrated lower position. In such lower position, therefore, the circuit 17 permits direct access of the then-addressed one of the S-bit storage locations of the memory bank 16A to the programming input 103 of the associated stage 4A of the counter 3. In this latter case, the contents of such addressed storage location may be read out by operation of the switch 18 in the "read" mode.

For operation in the frequency sweep mode, the upper position of the switch 24 is used, so that the steady increment of the count in the stage 15A by the clock pulse generator 13 is transferred via gating circuit 17 to the auxiliary input 103 of the stage 111, thereby causing the frequency of the VCO to be swept accordingly.

Figure 3:
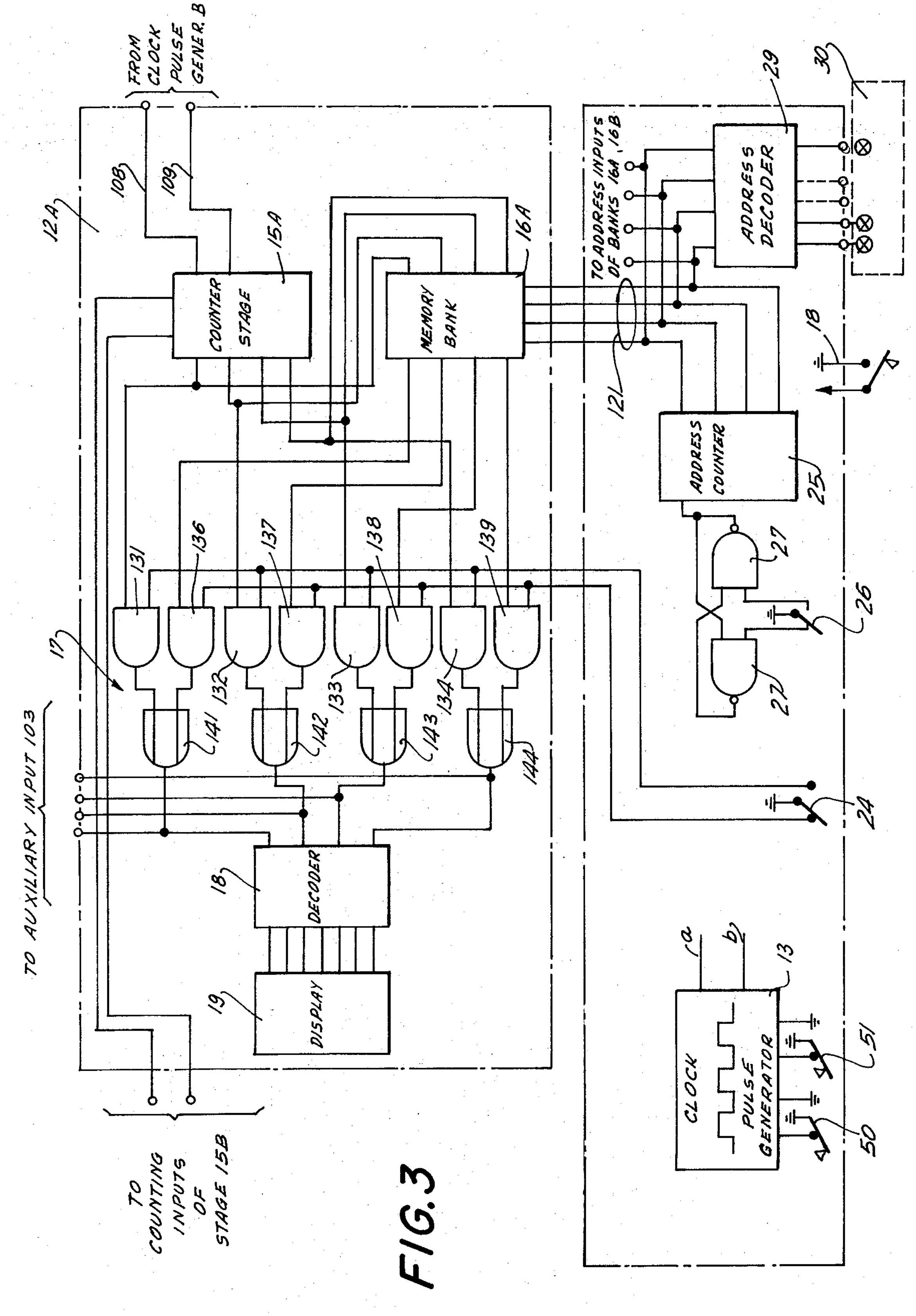

The arrangement generally depicted in FIG. 2 is shown in more detail in FIG. 3. The four output leads representing the 4-bit parallel output 111 of the stage 15A are individually applied to first inputs of AND gates 131, 132, 133 and 134 in the gating circuit 17. The four output leads representing the 4-bit contents of the addressed storage location of the associated memory bank 16A are coupled to first inputs of AND gates 136, 137, 138 and 139 in the gating circuit 17. The outputs of the gate pair 131 and 136 are applied via an OR gate 141 to lead A of the 4-lead auxiliary output of the control unit 12A. In like manner, the outputs of the gate pairs 132 and 137, 133 and 138, and 134 and 139 are respectively applied through OR gates 142, 143 and 144 to auxiliary output leads B, C and D of control unit 12A. The switch 24 is arranged to selectively excite the second inputs of either the gates 131, 132, 133 and 134 (thereby directly applying the output of the counter stage 15A to the leads A, B, C, and D) or the gates 136, 137, 138 and 139 (thereby applying the output of the memory bank 16A to the leads A, B, C, D. For visual display purposes, the outputs of the OR gates 141–144 are also applied via decoder 18 to the count display device 19.

The addressing of the separate storage locations of the memory bank 16A may be accomplished, e.g., with a third single-stage BCD counter 25, which may be stepped by a push button operated flip-flop circuit 27. Assuming a 4-bit BCD output of the counter 25, sixteen unique storage addresses in the memory bank 16A (and a corresponding number of storage addresses in the memory banks 16B and 16C associated with the counter stages 15B and 15C) may be utilized to accommodate up to sixteen pre-set transmitter stations within the range of tuning of the receiver. An address decoder 29 and address display 30 may also be provided for visually monitoring the then-addressed storage locations in the memory bank 16A.

Figure 4:
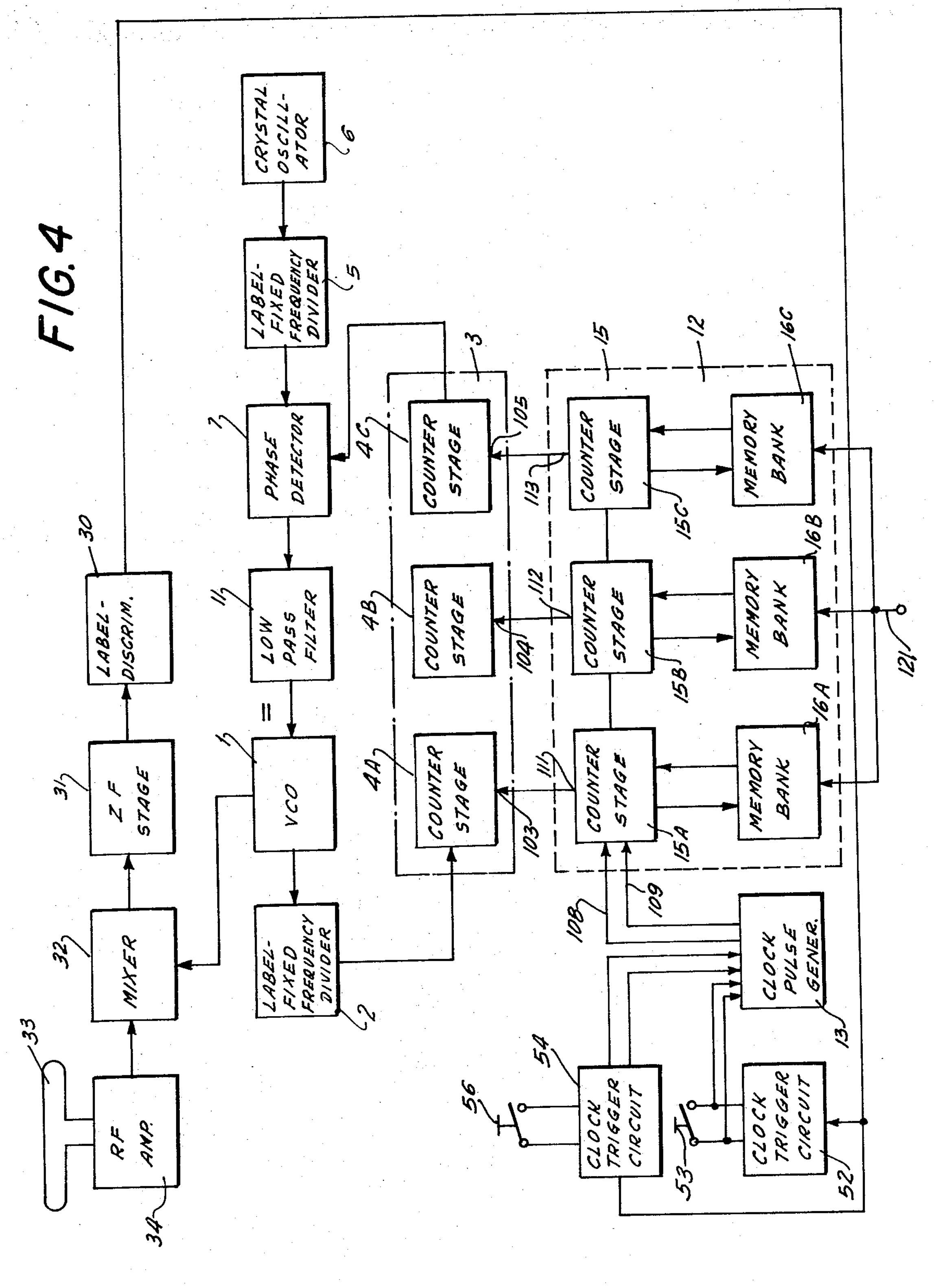
FIG. 4 is a block diagram similar to FIG. 1 but including added facilities for instrumenting a frequency-sweep, signal-seeking capability of the receiver.

FIG. 4 illustrates an arrangement whereby the clock-controlled counter 15 may be advantageously employed in its frequency sweep mode in a radio receiver having signal-seeking and lock-on capabilities. The additional receiver components shown in FIG. 4 include an antenna 33, an RF amplifier 34, a mixer 32, an IF stage 31 and a discriminator circuit 30. The VCO 1 (whose frequency control circuitry is identical to the corresponding facilities shown in FIG. 1) serves in the arrangement of FIG. 4 as an adjustable local oscillator.

The count programming circuitry for the frequency divider counter 3 in the VCO control loop includes, as in FIG. 1, the second counter 15, the associated memory banks 16A, 16B and 16C, and the clock pulse generator 13 whose forward and reverse outputs 108 and 109 are applied to the appropriate count inputs of the stage 15A. The arrangement of FIG. 4 additionally includes a pair of push-button controlled clock trigger circuits 52 and 54 which individually serve, upon the depression of push buttons 53 and 56, to initiate forward and reverse count increments of the counter 15. The trigger circuits also have auxiliary inputs coupled to the discriminator 30, the excitation of each such auxiliary input causing the disabling of the clock pulse generator to terminate the count.

Since programming of the counter 3 in the frequency sweep mode is contemplated in the arrangement of FIG. 4, the initiation of the clock sequence on the lead 108 of the generator 13 by depressing the push button 53 will successively advance the count in counter 15 and will thereby successively advance the count in the counter 3. The VCO 1 will correspondingly be swept in frequency and, during such frequency sweep, the amplitude of the corresponding transmitted frequencies incident on the antenna 33 will be monitored by the receiver and compared with a predetermined threshold. Upon the reception of a transmitted frequency that exceeds the threshold, the discriminator 30 will outpulse a control indication to the auxiliary input of the clock pulse trigger circuit 52. Such circuit 52 is thereby actuated to disable the clock pulse generator 13 to stop the frequency sweep. The receiver is thereupon permitted to lock on the strong transmitted signal. Once the generator 13 is thus disabled, it will remain disabled until the next manual depression of the push-button 53.

It will be appreciated that a similar sweep and lock-on capability is available for reverse counting by correspondingly utilizing the clock pulse trigger circuit 54 and the associated push button 56.

Figure 5:
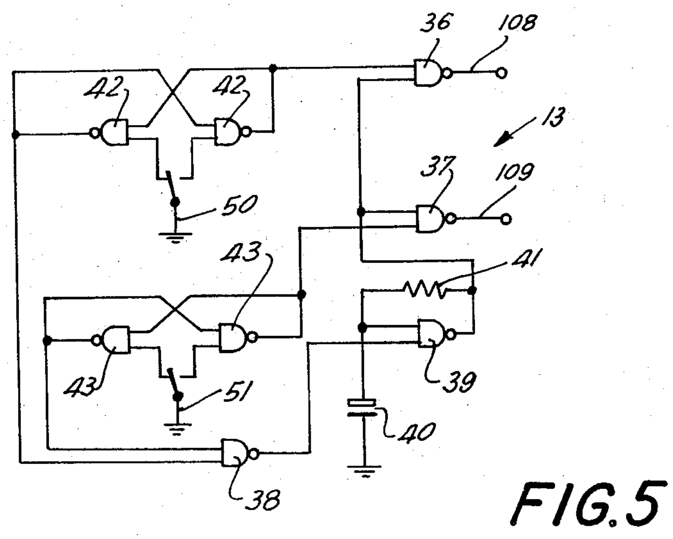
FIG. 5 is a schematic diagram of a clock pulse generator suitable for use in the arrangements of FIGS. 1–4.

FIG. 5 shows an illustrative embodiment of the clock pulse generator 13. The pulse generating portion per se includes a gate 39 having first and second inputs, and an R-C integrating path extending from the output of the gate 39 to the first input thereof. Operation of such pulse generating portion may be triggered by the application of a signal to the second input of the gate 39 from the output of a gate 38. The gate 38, in turn, is excited upon the depression of either the "forward" push button 50 or the "reverse" push button 51. In particular, depression of one of the buttons 50 and 51 triggers an associated one of flip-flops 42 and 43, one output each of which is coupled to separate inputs of the gate 38.

In order to couple the pulse generated by the gate 39 and the associated circuitry to the appropriate output lines 108 or 109, the output of the gate 39 is applied in parallel to first inputs of gates 36 and 37, whose outputs respectively excite lines 108 and 109. The remaining outputs of the flip-flops 42 and 43 are separately applied to the second inputs of the gates 36 and 37.

With this arrangement, depression of the button 50 couples the generated clock pulses to the "forward" line 108, while depression of the button 51 couples the generated clock pulses to the reverse line 109.

In the foregoing, the invention has been described in connection with preferred arrangements thereof. Many variations and modifications will now occur to those skilled in the art. It is accordingly desired that the scope of the appended claims not be limited to the specific disclosure herein contained.

What is claimed is:

1. In an apparatus for regulating the output frequency of a voltage controlled oscillator wherein the apparatus includes an adjustable frequency divider comprising a first programmable digital counter disposed in the main regulating path of the oscillator and having N successively higher order cascaded stages each of which has an auxiliary S-bit parallel input responsive to digital command signals for individually adjusting the count of such stage, and wherein the output frequency of the oscillator is adjusted by an error signal derived from a comparison of the frequency at the first counter output and a reference frequency, an improved arrangement for adjusting the instantaneous count of the first counter, which comprises:

a second digital counter independent of the main regulating path of the oscillator and having N successively higher order cascaded stages, each such stage including an auxiliary S-bit parallel output representative of the instantaneous count of such stage;

a clock pulse generator;

first means for coupling the output of the clock pulse generator to the count input of the lowest order stage of the second counter;

N programmable storage means individually connectable to the N-stages of the first counter for programming the first counter with a count programmed in the storage means;

second means for selectively coupling the auxiliary outputs of the stages of the second counter to the respective auxiliary inputs of the corresponding stages of the first counter; and third means for selectively coupling the auxiliary outputs of the stages of the second counter to the respective inputs of the N-storage means for writing prescribed counts of the second counter into the N-storage means.

2. Apparatus as defined in claim 1, further comprising N decoding means individually connectable to the auxiliary outputs of the stages of the second counter, and N means individually coupled to the outputs of the N decoding means for displaying a visual indication of the count of the associated second counter stage.

3. Apparatus as defined in claim 1, in which the clock pulse generator has separately energizable first and second outputs; each stage of the second counter has forward and reverse counting inputs; and the first coupling means connects the first output of the clock pulse generator to the forward counting input of the lowest stage of the second counter and further connects the second output of the clock pulse generator to the reverse counting input of the lowest stage of the second counter.

4. Apparatus as defined in claim 3, in which the clock pulse generator comprises, in combination, first and second gates each having first and second inputs, the output of the first gate constituting the first output of the clock pulse generator and the output of the second gate constituting the second output of the clock pulse generator; a third gate having first and second inputs; first and second flip-flop circuits; means for coupling one output of the first flip-flop circuit to the first input of the first gate; means for coupling the other output of the first flip-flop circuit to the first input of the third gate; means for coupling one output of the second flip-flop circuit to the first input of the second gate; means for coupling the other output of the second flip-flop circuit to the second input of the third gate; a fourth gate having first and second inputs; means including an R-C integrating path for feeding the output of the fourth gate back to the first input thereof; means for coupling the output of the third gate to the second input of the fourth gate; and means for coupling the output of the fourth gate in parallel to the second inputs of the first and second gates.

5. In an apparatus for regulating the output frequency of a voltage controlled oscillator which is disposed in the tuning stage of a signal-seeking communications receiver and which is adjustable to sweep a selected portion of the frequency band received by the receiver, the receiver having facilities for detecting within the swept band a signal whose amplitude exceeds a predetermined threshold, wherein the apparatus includes a first programmable digital counter having N successively higher order cascaded stages each of which has an auxiliary S-bit parallel input responsive to digital command signals for individually adjusting the count of such stage, the output frequency of the oscillator being divided by a factor proportional to the total count of the first counter; and wherein the output frequency of the oscillator is adjusted by an error signal derived from a comparison of the divided frequency and a reference frequency, an improved arrangement for successively varying the instantaneous count of the first counter to sweep the frequency band and for terminating the sweep upon the detection of a signal having an amplitude above the threshold, which comprises:

a second digital counter having N cascaded stages, each such stage including an auxiliary S-bit parallel output representative of the instantaneous count of such stage;

a normally unoperated clock pulse generator;

first means for coupling the output of the clock pulse generator to the counting input of the lowest order stage of the second counter;

second means for individually coupling the auxiliary outputs of each stage of the second counter to the auxiliary inputs of the corresponding stages of the first counter to sweep a desired portion of the frequency band when the clock pulse generator is operated;

normally deenergized switching means having a first input energizable to operate the clock pulse generated and to initiate the sweep of the frequency band and a second input energizable to disable the clock pulse generator to terminate the sweep; and means responsive to the reception of a signal having an amplitude above the threshhold for energizing the second input of the switching means.

6. In an apparatus for regulating the output frequency of a voltage controlled oscillator wherein the apparatus includes a first programmable digital counter having N cascaded stages each of which has an auxiliary S-bit parallel input responsive to digital command signals for individually adjusting the count of such stage, the output frequency of the oscillator being divided by a factor proportional to the total count of the first counter; and wherein the output frequency of the oscillator is adjusted by an error signal derived from a comparison of the divided frequency and a reference frequency, an improved arrangement for adjusting the instantaneous count of the first counter, which comprises:

a second digital counter having N successively higher order cascaded stages each such stage including an auxiliary S-bit parallel output representative of the instantaneous count of such stage;

a clock pulse generator;

first means for coupling the output of the clock pulse generator to the counting input of the lowest order stage of the second counter;

N-storage means each having at least one externally adressable S-bit storage location;

second means coupling the auxiliary output of each stage of the second counter to the associated one of the storage means for selectively writing the S-bit count of such stage into a then-addressed location of the associated storage means;

N gating means individually connectable to the N-stages of the first and second counters and with the N-storage means, each gating means having an S-bit parallel output and first and second S-bit parallel inputs, each gating means being arranged to selectively interconnect said output with either the first or the second input thereof;

third means for individually coupling to the first and second inputs of each of the N gating means the auxiliary outputs of the associated stages of the second counter and the S-bit contents of a then-addressed location of the associated storage means; and fourth means for individually coupling the outputs of the N gating means to the auxiliary inputs of the associated N-stages of the first counter.

7. Apparatus as defined in claim 6, in which the apparatus further comprises means including a third digital counter for addressing each of the N-storage means.

* * * * *